(12) United States Patent
Murata et al.

(10) Patent No.: US 8,421,512 B2
(45) Date of Patent: Apr. 16, 2013

(54) DUTY COMPENSATION CIRCUIT

(75) Inventors: Tomoo Murata, Hamura (JP); Takeo Yamashita, Ome (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/166,709

(22) Filed: Jun. 22, 2011

(65) Prior Publication Data

US 2011/0316603 A1 Dec. 29, 2011

(30) Foreign Application Priority Data

Jun. 25, 2010 (JP) ................................. 2010-144422

(51) Int. Cl.
*H03K 3/017* (2006.01)
(52) U.S. Cl.
USPC .......................................... 327/175; 327/172
(58) Field of Classification Search ........................ None
See application file for complete search history.

(56) References Cited

U.S. PATENT DOCUMENTS

| | | | |
|---|---|---|---|
| 2005/0134341 A1* | 6/2005 | Lee | 327/172 |
| 2006/0232311 A1* | 10/2006 | Kitayama | 327/172 |
| 2009/0243677 A1* | 10/2009 | Becker et al. | 327/158 |
| 2009/0284290 A1* | 11/2009 | Kuroki et al. | 327/158 |
| 2009/0289679 A1* | 11/2009 | Kuroki et al. | 327/175 |
| 2010/0073057 A1* | 3/2010 | Ku | 327/175 |
| 2010/0073058 A1* | 3/2010 | Ohtomo et al. | 327/175 |
| 2010/0117702 A1* | 5/2010 | Jang et al. | 327/175 |
| 2010/0127733 A1* | 5/2010 | Kikuchi | 327/31 |

FOREIGN PATENT DOCUMENTS

JP 2001-124813 A 5/2001

\* cited by examiner

*Primary Examiner* — Cassandra Cox
(74) *Attorney, Agent, or Firm* — Miles & Stockbridge P.C.

(57) ABSTRACT

A duty compensation circuit including a duty detection circuit, a duty adjustment signal generator for generating a control signal from a detected duty, and a duty adjustment circuit, in which the duty detection circuit executes sampling of a clock at sampling timing obtained by causing the clock to be delayed by a variable delay circuit, thereby detecting a duty. Thereby, duty compensation is enabled without preparing a clock higher in operating speed than a clock before compensation.

6 Claims, 9 Drawing Sheets

DUTY COMPENSATION CIRCUIT

CLAIM OF PRIORITY

The present application claims priority from Japanese patent application JP 2010-144422 filed on Jun. 25, 2010, the content of which is hereby incorporated by reference into this application.

FIELD OF THE INVENTION

The present invention relates to a duty compensation circuit suitable for use in a high-speed circuit such as high-speed MUX/DEMUX, and so forth, for an SoC (System on Chip) tester.

BACKGROUND OF THE INVENTION

With a microcomputer for a low-speed operation, as shown in FIG. 5, a sampling clock 502 operating at frequencies higher than a clock 501 before compensation is inputted from an external input, for the purpose of testing, thereby working out a duty (duty cycle). High/Low is decided on a resolution-by-resolution basis, the resolution being determined by the sampling clock 502, and because, for example, four High periods, and eight Low periods are present, duties are computed to be on the order of about 30% to thereby executing duty compensation. Such an example has been described in Japanese Unexamined Patent Application Publication No. 2001-124813.

SUMMARY OF THE INVENTION

FIG. 10 shows a configuration of a high-speed SoC tester by way of example. As shown in the figure, a high-speed SoC tester 1007 is comprised of a controller IC 1001 for executing control, signal generation, and processing, a MUX-IC (multiplexer IC) 1002 for executing parallel-serial conversion of a signal received from the controller IC 1001, a driver IC 1003 for receiving a serial signal to drive a DUT (Device Under Test) 1004, a comparator 1005 for converting a signal outputted from the DUT 1004 into an internal signal, and a DEMUX-IC (demultiplexer IC) 1006 for executing serial-parallel conversion of the signal received by the comparator 1005. With the SoC tester, the MUX-IC 1002, and the DEMUX-IC 1006 normally need to have a phase adjustment function besides a parallel-serial conversion function in order to adjust the phase of a signal inputted to the DUT 1004 to thereby adjust the phase of a signal inputted to a timing window where the DUT 1004 can fetch the signal, to test the timing window capable of fetching the signal, and to test output timing of the signal from the DUT 1004.

FIG. 9 is a block diagram of the MUX-IC 1002 for the SoC tester. As shown in the figure, the MUX-IC 1002 is comprised of a MUX (multiplexer) 901 for executing parallel-serial conversion of low-speed data, a PLL (Phase Lock Loop) 902 for feeding a clock to the MUX 901, a delay line variable delayer 903 for executing phase adjustment of output data, and a clock line variable delayer 904 for executing phase adjustment of a clock. The PLL 902 outputs a clock multiplied from a reference clock inputted from an input terminal 905. The MUX 901 converts a parallel signal inputted from an input terminal 906 into a serial signal according to the clock multiplied. At this point in time, the clock outputted from the PLL 902, and a phase of the parallel signal inputted from the input terminal 906 are adjusted by the variable delayer 904 inserted between the PLL 902 and the MUX 901, and at the same time, the clock is outputted to a clock output 908. The variable delayer 903 executes phase adjustment of the signal after serial conversion, thereby outputting data to a data output 907.

FIG. 11 is a block diagram of the DEMUX-IC 1006 for the SoC tester. As shown in the figure, the DEMUX-IC 1006 is comprised of a DEMUX (demultiplexer) 1101 for executing serial-parallel conversion of high-speed data, a CDR (Clock Data Recovery) 1102 for reproducing a clock from data, a data line variable delayer 1103 for executing phase adjustment of input data, and a clock line variable delayer 1104 for executing phase adjustment of a clock. The CDR 1102 reproduces data and a clock from data inputted from an input terminal 1105. The DEMUX 1101 executes the serial-parallel conversion according to a clock reproduced from the data inputted from the input terminal 1105. At this point in time, phase adjustment of output data in whole is executed by the variable delayer 1103 inserted in the front-end stage of the DEMUX 1101. The variable delayer 1104 has a function for adjusting the reproduced clock so as to have a phase easiest in acquiring the data.

With a tester where a transfer signal is at a low speed, even if the signal passes through delayers in multi-stages during the phase adjustment of a clock and data, this will not pose a major problem. However, if a duty even slightly deviates from 50% in the case where the transfer signal is in a high-speed operation region with frequencies exceeding 1 GHz, this will cause the duty to undergo an accelerated increase in deviation due to unbalance in transistor's heat build-up between the polarities of the signal. Accordingly, if the signal passes through delayers in multiple stages as is the case with the variable delayers, duty deviation will be accumulated. Although such a phenomenon itself can occur even to a low-speed tester, the duty deviation will be low in level, posing therefore no problem, whereas, with a high-speed system circuit, a drive circuit data system has the risk of occurrence of a problem in that a signal waveform (timing) to be transferred to a DUT will vary according to a set value of a variable delayer, and data corruption occurs in the worst case. Further, a clock system has the risk of occurrence of a problem in that CDR accuracy will deteriorate due to duty deviation, the signal cannot be fetched by DDR (Double Data Rate: a method for acquiring a signal at respective edges of positive/negative polarities of a clock) input, and the waveform is lost in the worst case.

Accordingly, in order to maintain the duty of a signal, it is essential to insert a duty compensation circuit within a variable delayer circuit to thereby maintain the duty at 50%. However, it is very difficult to apply such a method as described under the heading of BACKGROUND OF THE INVENTION in a high frequency region with an internal clock exceeding 1 GHz.

A typical example of the invention is shown as follows.

According to one aspect of the invention, a duty compensation circuit includes a duty adjustment circuit that adjusts a duty of a first clock signal, a duty detection circuit that detects the duty of the first clock signal or a duty of a clock-after-adjustment signal adjusted by the duty adjustment circuit, and a duty adjustment signal generator that generates a control signal controlling an amount of duty adjustment executed by the duty adjustment circuit, and outputting the control signal to the duty adjustment circuit, and the duty detection circuit executes sampling of the first clock signal or the clock-after-adjustment signal at sampling timing obtained by causing a second clock signal to be delayed by a variable delay circuit, thereby detecting the duty of the first clock signal or the clock-after-adjustment signal.

The invention has an advantageous effect in that duty compensation is enabled without preparing a clock higher in operating speed than a clock before compensation.

DETAILED DESCRIPTION OF THE PREFERRED EMBODIMENTS

Embodiments of the invention are described in detail hereinafter with reference to the accompanying drawings. Elements making up respective blocks of each embodiment of the invention are formed on a semiconductor substrate by use of the known IC technology.

Figure 1:
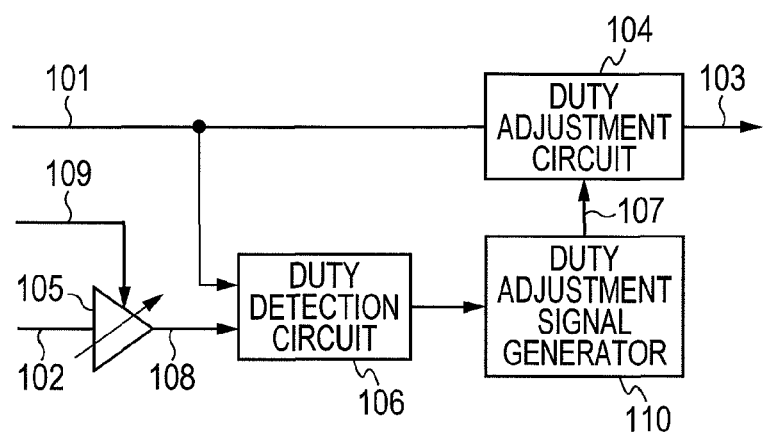
FIG. 1 is a block diagram showing a basic configuration of a duty compensation circuit.

FIG. 1 shows a basic configuration of a duty compensation circuit. A variable delayer 105 has a sampling pulse 102 input, and a delay value control 109, outputting sampling timing 108. A duty detection circuit 106 receives a clock before compensation 101 (this may be a duty-adjusted clock after execution of duty adjustment as described later on in a fourth embodiment of the invention) and the sampling timing 108, respectively, as an input, thereby detecting a relevant duty, and a duty adjustment signal generator 110 outputs a adjustment signal 107 such that a duty will be at 50% on the basis of the relevant duty. A duty adjustment circuit 104 receives the clock before compensation 101, and the adjustment signal 107, respectively, as an input, thereby outputting a duty-adjusted clock 103.

The variable delayer 105 generates sampling timing for every delay-difference between variable delay values by sweeping pulses of the sampling pulse 102 according to a value of the delay value control 109. In this case, the sampling pulse 102 need not be a periodically occurring clock. Further, the sampling timing corresponds to one cycle (1/frequency) in the case of using a sampling clock. The duty detection circuit 106 detects a duty of the clock before compensation 101 by use of the sampling timing generated by the variable delayer 105. On the basis of the duty as detected, the duty-adjusted clock 103 is generated such that the duty thereof will be at about 50%.

First Embodiment

Figure 14A:
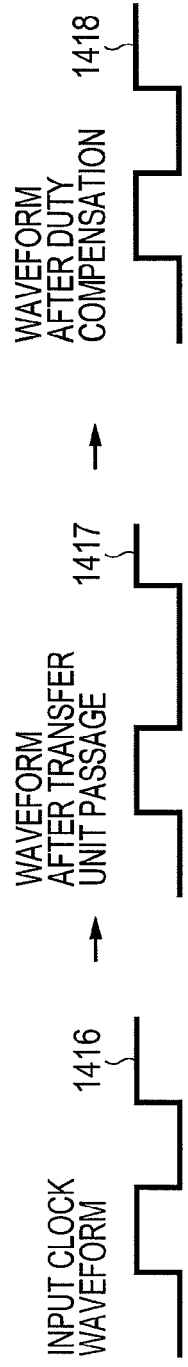
FIG. 14A is a schematic representation showing a waveform after duty adjustment.
Figure 14B:
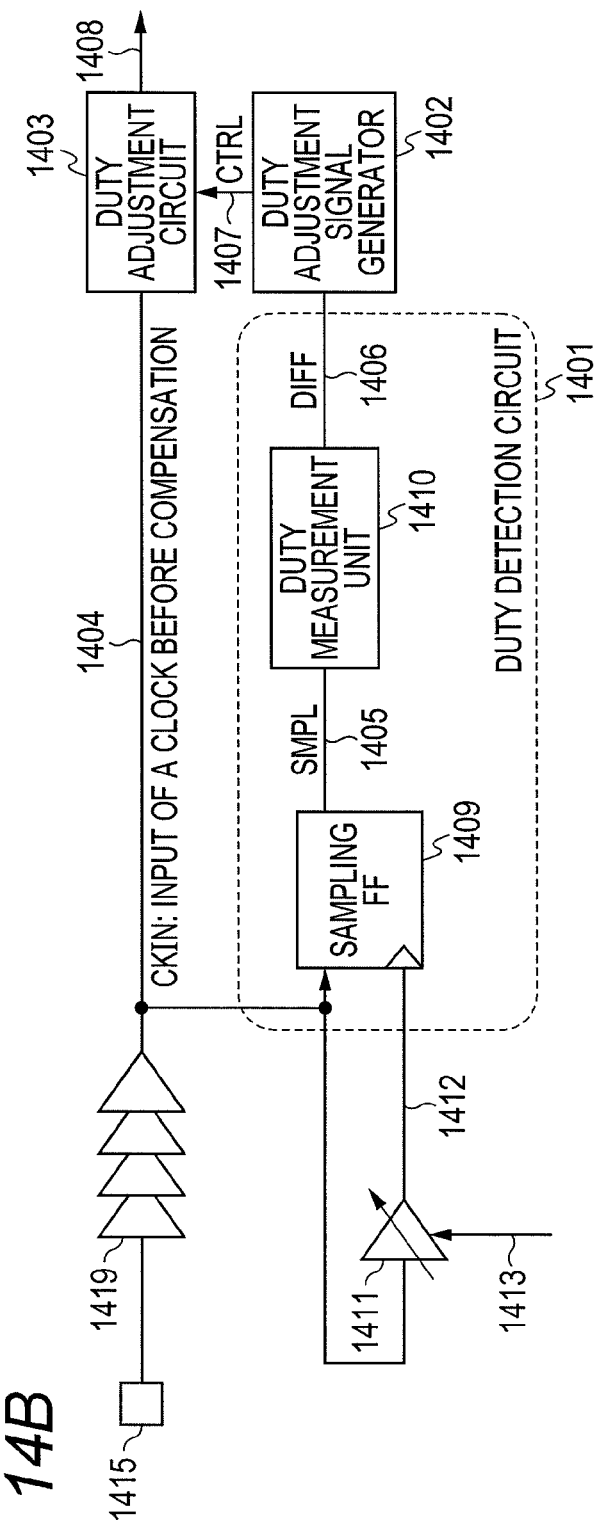
FIG. 14B is a block diagram showing a configuration example of a duty compensation circuit according to a first embodiment of the invention.

FIG. 14B shows a duty compensation circuit according to a first embodiment of the invention. As shown in FIG. 14A, a clock waveform 1416 inputted to a clock input terminal 1415 is transferred to a transfer unit 1419 to be turned into a waveform after transfer unit passage 1417. The waveform after transfer unit passage 1417 as a clock before compensation is adjusted by a duty adjustment circuit, which will be described in detail hereunder, whereupon a waveform after duty adjustment 1418 is outputted.

A duty detection circuit 1401 outputs information of duty 1406 (DIFF) from an input of a clock before compensation (CKIN) 1404. A duty adjustment signal generator 1402 receives the information of duty 1406 (DIFF) as an input to thereby output an adjustment signal 1407 (CTRL). A duty adjustment circuit 1403 receives the clock CKIN 1404, and the adjustment signal 1407 to thereby output a clock after duty adjustment 1408.

The duty detection circuit 1401 is comprised of a sampling FF 1409 for sampling the clock before compensation 1404 (CKIN), and a duty measurement unit 1410 for outputting information of duty on the basis of results of counting High-periods, and Low-periods of sampling. A connective relationship in the duty detection circuit 1401 is given as follows; the clock before compensation 1404 (CKIN) is delivered to a variable delay circuit 1411 to serve as a sampling clock 1412. The sampling FF 1409 receives the clock before compensation 1404 (CKIN) as a data input, and the sampling clock 1412 as a clock input, thereby outputting a sampling result 1405 (SMPL). The duty measurement unit 1410 receives the sampling result 1405 as an input, thereby outputting the information of duty 1406 (DIFF).

Figure 3:
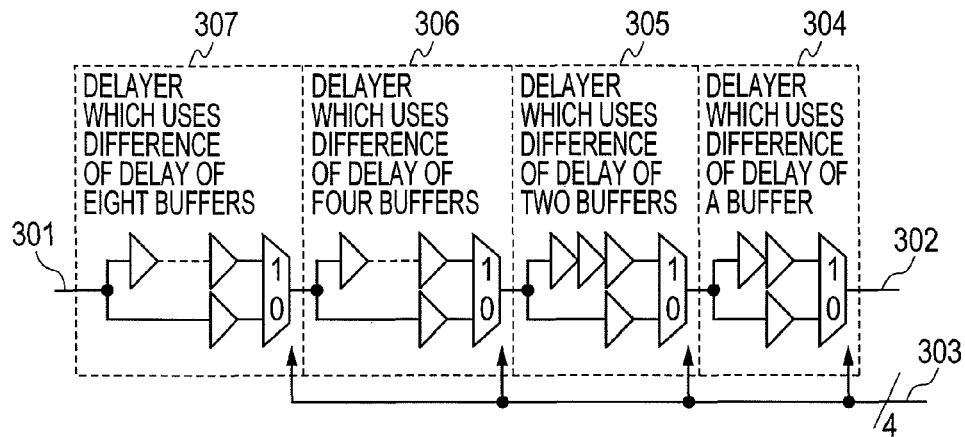
FIG. 3 is a block diagram showing a configuration example of a variable delay circuit.

FIG. 3 shows a configuration of a variable delay circuit by way of example. An input terminal 301 is connected in series with delay stages 304 to 307 to be further connected with an output terminal 302. The respective delay stages are made up by a multiplexer, and a buffer differing in the number of the delay stages, and are capable of changing over a delay amount by switching among transfer paths by use of a control terminal 303. In the case of an example shown in FIG. 3, by switching among stage 1 (delayer which uses difference of delay of a buffer) 304 to stage 4 (delayer which uses difference of delay of eight buffers) 307, it is possible to adjust a delay amount ranging from delayer which uses difference of delay of a buffer to 15-step difference. Further, as for the delay stage, a differential of 5 ps can be easily produced by use of one stage of an emitter-follower EF, and in the case of the present configuration, there is prepared a variable delay circuit of resolution: 5 ps, Full Scale: 45 ps. In order to realize the resolution of 5 ps at a high-speed clock according to the related art, a frequency at 200 GHz is required, which is extremely difficult to implement. If the frequency of a clock before compensation is at 5 GHz, it need only be sufficient to prepare 180 ps by use of six stages of 1/2/4/8/16/32 steps.

Figure 8A:
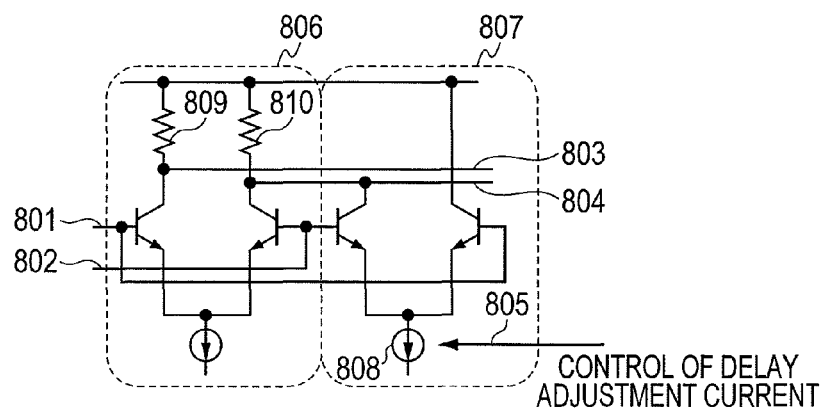
FIG. 8A is a block diagram showing a configuration example of a variable delay circuit.

FIG. 8A shows a configuration example of a high-resolution variable delay circuit for realization of higher resolution. This variable delay circuit is comprised of a CML (Current Mode Logic) differential stage 806, and a delay adjustment stage 807. The CML differential stage 806 has a positive input 801, and a negative input 802, respectively, as an input, having a positive output 803, and a negative output 804, respectively, as an output. The delay adjustment stage 807 has a delay adjust terminal 805, the positive input 801, and the negative input 802, respectively, as an input, to be connected to the positive output 803, and the negative output 804. In the case where delay setting is not performed, current from a delay adjust current source 808 is turned OFF by controlling the delay adjust terminal 805.

Figure 8B:
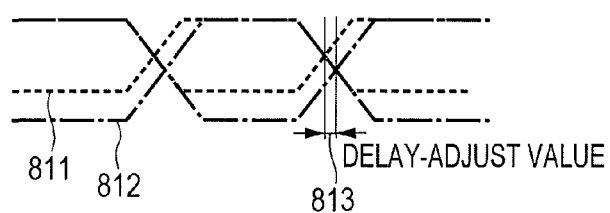
FIG. 8B is a waveform chart showing an output waveform of the variable delay circuit.
Figure 9:
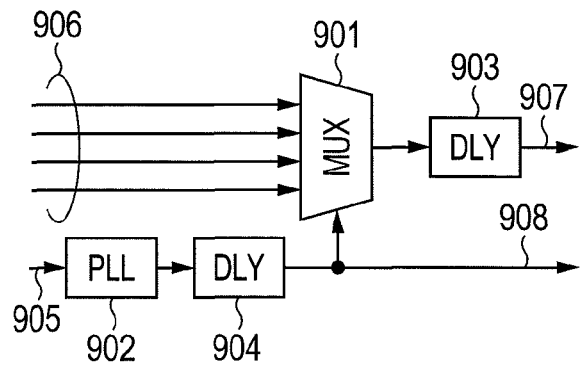
FIG. 9 is a block diagram showing a configuration example of a SoC tester.
Figure 10:
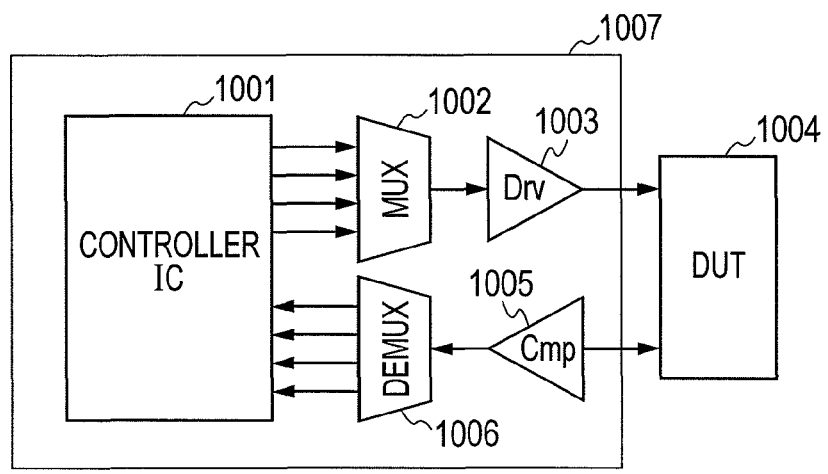
FIG. 10 is a block diagram showing a configuration example of a multiplexer IC.
Figure 11:
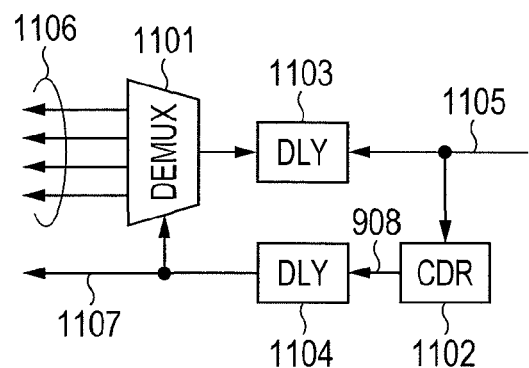
FIG. 11 is a block diagram showing a configuration example of a multiplexer IC.

In such a case, an output waveform is the same as a normal output waveform of the CML differential stage 806. In the case where the delay setting is performed, current is caused to flow to the delay adjust current source 808 by controlling the delay adjust terminal 805, whereupon there occurs an increase in current flowing through resistors 809, 810, for determining a differential amplitude, thereby causing an increase in the differential amplitude. Accordingly, a delay amount can be rendered larger by a difference 813 between waveforms 811 and 812 (refer to FIG. 8B).

Figure 7:
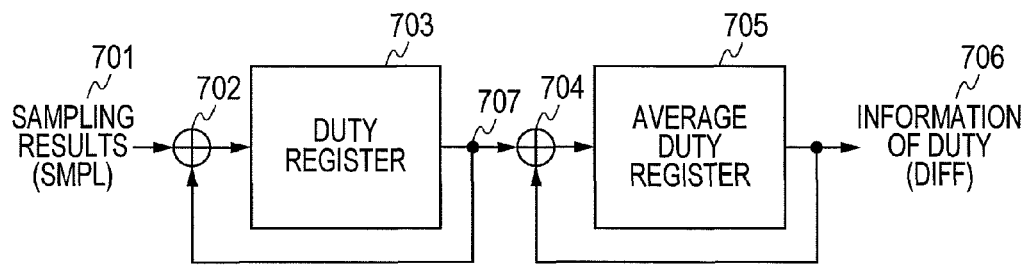
FIG. 7 is a block diagram showing a configuration example of a duty measurement unit.

FIG. 7 shows a configuration example of a duty measurement unit. A sampling result (SMPL) from an input terminal 701 and an output of a duty register 703 are delivered to an adder 702, results of which is stored in the duty register 703 in sync with a clock, thereby forming a feedback loop. An output of the loop is information of duty 707 expressing a difference between High periods and Low periods of every clock before compensation. The sampling FF 1409 is connected to the input terminal 701.

As is the case with the feedback loop, the information of duty 707 and an output of an average duty register 705 are delivered to an adder 704, results of which are stored in the average duty register 705 in sync with a clock, thereby forming a feedback loop. Information of duty 706 is an output of the loop, representing the result of duty quantification. The reason why the loop in the back-end stage is provided is that if the duty adjustment is executed on the basis of a duty value, as it is, for every clock before compensation, this will raise the risk of jitter occurring to the clock due to frequent execution of control. In other words, the loop in the back-end stage is intended to average duties (duty cycles) of respective clocks before compensation to thereby prevent occurrence of the jitter. Further, in the case of the example shown in FIG. 7, the configuration including the adder and the register is described, however, use may be made of an analog circuit including a charge pump, and so forth.

Figure 4A:
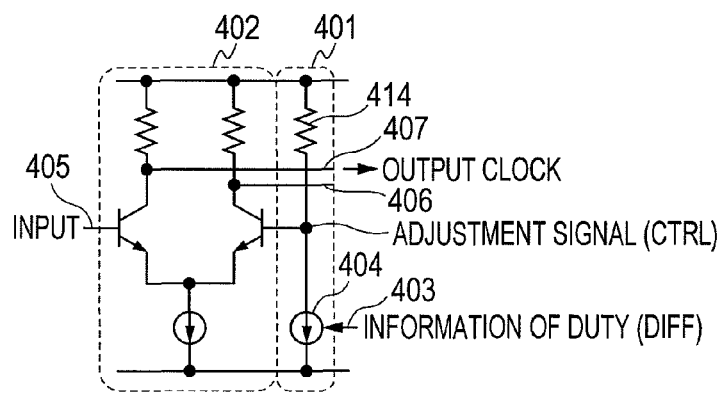
FIG. 4A is a block diagram showing a configuration example of a duty adjustment signal generator, and a duty adjustment circuit.

FIG. 4A shows a duty adjustment signal generator 401, and a duty adjustment circuit 402. The duty adjustment signal generator 401 has a duty-information signal input terminal 403 as an input to a duty-adjust current source 404, outputting an adjustment signal (CTRL). The duty adjustment circuit 402 is the same in circuit configuration as a normal CML circuit, receiving a clock-before-compensation signal at a positive input 405, and the adjustment signal (CTRL) at a negative input, thereby outputting a clock-after-adjustment signal to output terminals 406 and 407, respectively.

Figure 4B:
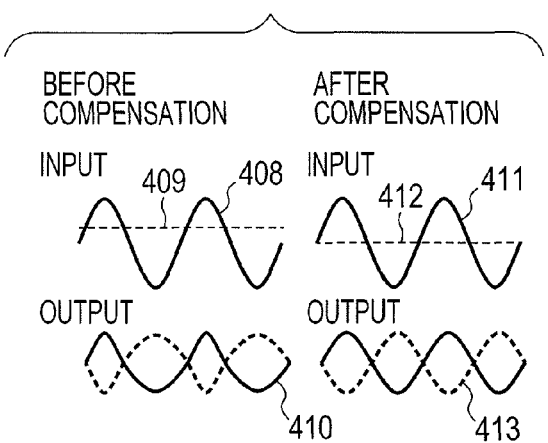
FIG. 4B is a waveform chart showing a duty adjustment method.
Figure 5:
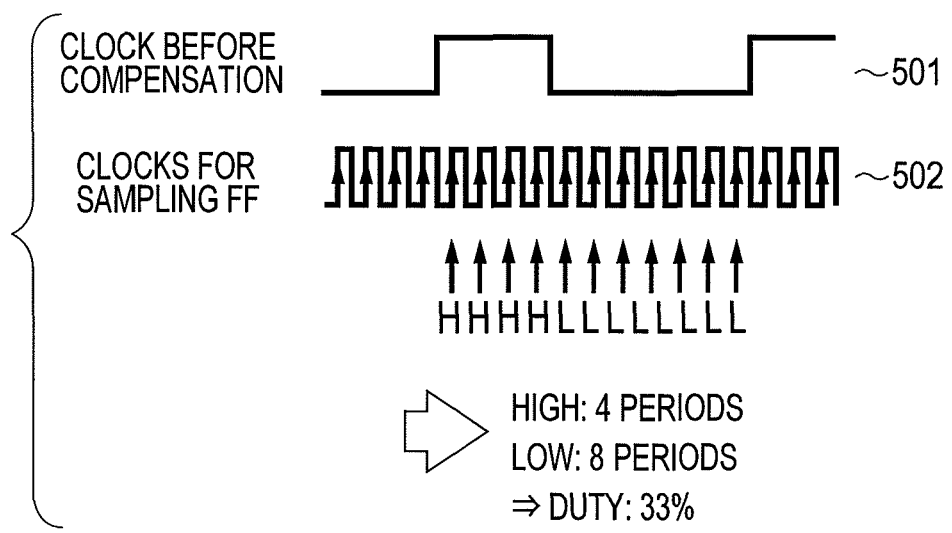
FIG. 5 is a schematic representation showing a sampling operation for related-art duty detection.

A clock adjustment method is described hereinafter with reference to FIG. 4B.

A clock signal is normally transferred as a differential signal, but at a point in time that the clock signal is rendered uni-polar, the differential signal is rid of the information of duty. Hence, a adjustment clock is generated from the single polarity of a clock, and a signal level serving as a reference. More specifically, assuming that a relationship among a clock-before-compensation waveform in a stage before compensation, an adjustment signal waveform, and an output waveform is referred to as 408 to 410, since a voltage level of an adjustment signal 409 is high, a duty of the output waveform is deviated. For this reason, an amount of current flowing to the duty-adjust current source 404 is caused to increase by controlling the duty-information signal input terminal 403. As a result, an output voltage of the adjustment signal (CTRL) dependent on a load resistor 414 and an amount of current flowing thereto will drop. As a result, a relationship among a clock-before-compensation waveform, the adjustment signal waveform, and the output waveform is changed as indicated by 411 to 413, so that an output duty can be adjusted to 50%.

Figure 2:
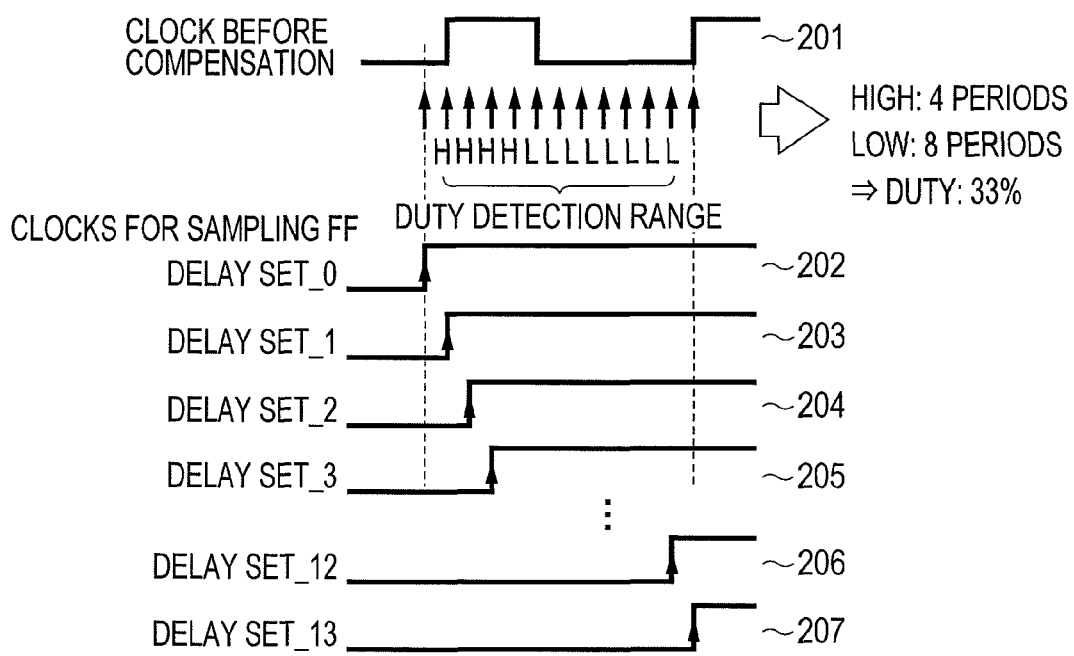
FIG. 2 is a schematic representation showing a sampling operation according to the invention.

FIG. 2 shows a waveform when sampling is performed in the circuit shown in FIG. 14. A logic level of a clock before compensation 201 is fetched while varying the phase of the sampling clock 1412 by sweeping over delay set values 0 to 13. As a result of determining High/Low for every delay set value, it turns out that duty cycles of the clock before compensation 201 are worked out to be on the order of about 30% on the basis of High periods: 4/Low periods: 8. Such computation of the duty cycles is executed through operation of the duty measurement unit 1410. Further, in the case shown in FIG. 2, resolution of each of the delay set values 0 to 13 is set by dividing the clock into 13 components; however, it goes without saying that the number of the components may be either increased, or decreased.

In the duty measurement unit 1410, since High-periods: 4/Low-periods: 8 for every cycle is established on the basis of a logical value fetched in the sampling FF 1409, −4 (the number of Low-periods is grater by 4) is determined by the register which holds current information of duty 703. At the time of a first comparison, the register which holds average information of duty 705 as well has a value of −4 (the number of Low-periods is grater by 4). As a result, the voltage of the adjustment signal 409, shown in FIG. 4A, drops, thereby applying control so as to cause a portion of the input waveform, on the High side thereof, to be thicker, so that a duty is improved (approaching 50%).

Further, at the time of a second comparison in comparison sequence, excess or deficiency of control applied at the first comparison is adjusted by the same operation described as above. An operation for this comparison may be performed once at the time of calibration, periodically, or routinely, according to precision as required.

Second Embodiment

With the first embodiment of the invention, the sampling timing is generated by causing the clock before compensation itself to be delayed. However, since it is the delay circuit itself that determines a sampling interval, a high-speed operation is unnecessary. Further, in the case of the first embodiment, the clock before compensation 1404 with a duty deviation occurring thereto is caused to further pass through the variable delay circuit, thereby raising the risk of a possibility that the duty deviation will undergo an accelerated increase, and a clock in high-speed operation will undergo waveform evanescence. Hence, it becomes difficult to carryout circuit designing. As discussed in the foregoing, the higher an operation frequency becomes in the future, the more pronounced this problem is expected to be. In addition, there has existed another problem that power consumption will increase in order to ensure a high-speed operation.

Figure 12:
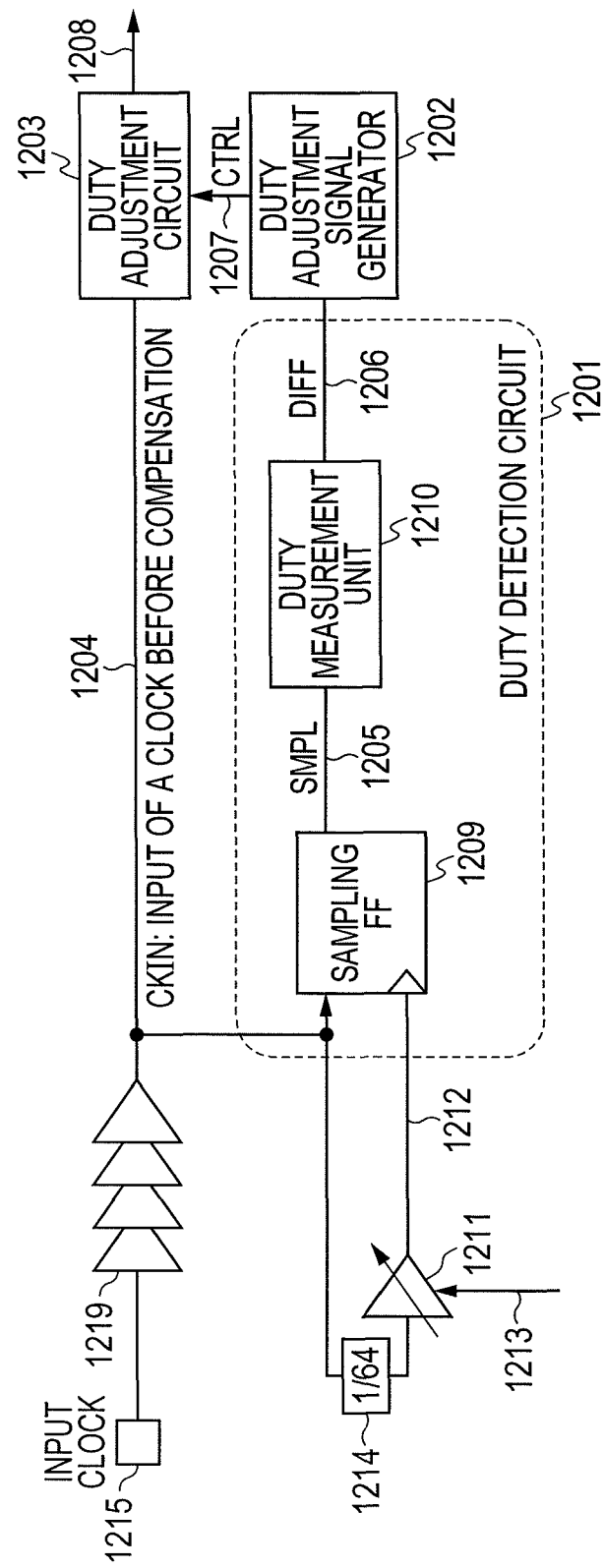
FIG. 12 is a block diagram showing a configuration example of a clock duty compensation circuit (a frequency divider added) according to a second embodiment of the invention.

FIG. 12 shows a configuration example of a duty compensation circuit that has solved those problems. The configuration shown in FIG. 12 differs from that shown in FIG. 14 in that a input of a clock before compensation 1204 is connected to a 1/64 frequency divider 1214 before connected to a variable delay circuit 1211. Otherwise, a connective relationship in FIG. 12 is the same as that in FIG. 14.

With the adoption of the configuration described as above, there is no change in an operation itself for duty adjustment of a clock; however, it becomes possible to utilize a slower clock obtained by dividing a clock, as the sampling clock, instead of the clock before compensation 1204 in operation at a high speed. By virtue of this effect, there is no need for caring about waveform evanescence in a clock transfer path, thereby rendering circuit designing easier. Furthermore, it is possible to decrease the number of buffer stages at the time of clock transfer, thereby enabling power consumption to be reduced.

Third Embodiment

With the second embodiment of the invention, the clock before compensation is inputted to the frequency divider, thereby realizing a low-speed operation. However, a waveform at the input of a clock before compensation 1204 is a clock waveform after transfer unit passage, which has passed through a transfer unit 1219, and a waveform duty ratio is therefore deviated. Accordingly, it is necessary to design an operable frequency of the frequency divider so as to enable a high-speed operation as compared with the case of the duty being at 50%, and the further the duty ratio of the clock before compensation is collapsed, the more difficult designing will become.

Figure 13:
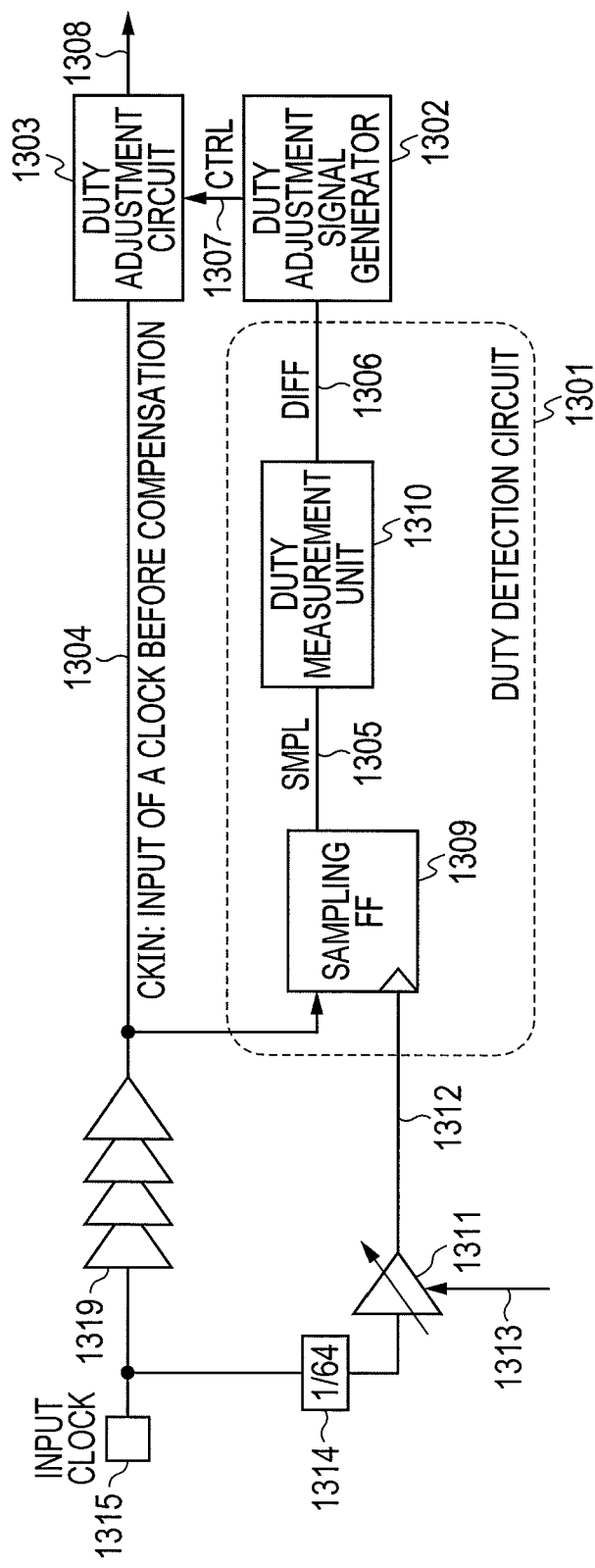
FIG. 13 is a block diagram showing a configuration example of a clock duty compensation circuit (a divided clock input point is changed) according to a third embodiment of the invention.

FIG. 13 shows a configuration example of a duty compensation circuit that has solved such a problem described as above. With the third embodiment, a transfer path from a clock source 1315 is split into two paths, one path being connected to an input of a transfer unit 1319, and the other path being connected to an input of a 1/64 frequency divider 1314. An output of the 1/64 frequency divider 1314 is connected to an input of a variable delay circuit 1311. Otherwise, a connective relationship of FIG. 13 is the same as that of the second embodiment of FIG. 12.

With the adoption of the configuration described as above, there is no change in an operation itself for duty adjustment of a clock, however, with the present embodiment, clock division can be effected by use of a clock without a duty deviation occurring thereto to thereby facilitate circuit designing for the 1/64 frequency divider 1314.

Fourth Embodiment

With the first through the third embodiments, the waveform after having passed through the transfer unit is delivered to the sampling FF, and the duty adjustment is executed after counting of a High/Low ratio (Feed Forward control), so that there is a risk that it is not possible to check whether or not the waveform after adjustment represents a waveform as properly adjusted. Further, there is a risk that it is not possible to adjust a duty deviation caused by the duty adjustment circuit itself.

Figure 6:
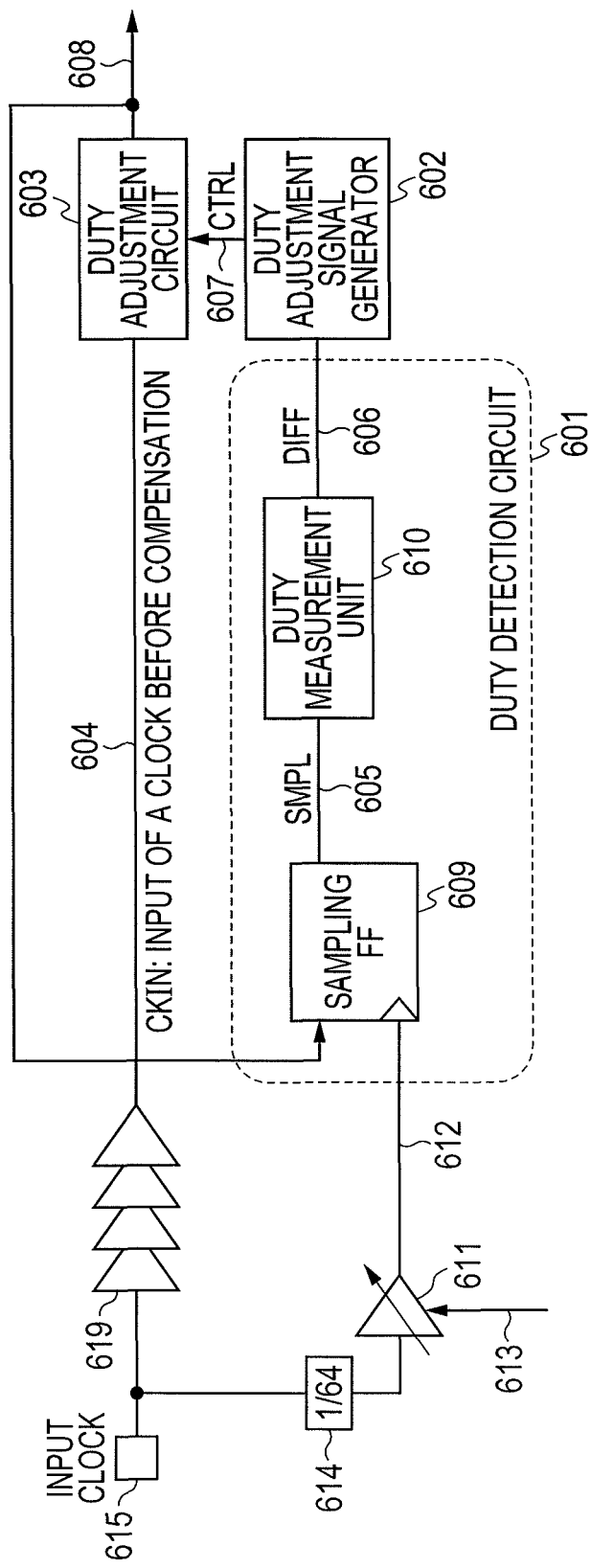
FIG. 6 is a block diagram showing a duty compensation circuit (a feedback type) according to a fourth embodiment of the invention.

FIG. 6 shows a configuration example of a duty compensation circuit that has solved those problems. With the fourth embodiment, the configuration is described as follows: an output of a duty adjustment circuit 603 instead of an output of a transfer unit 619 is an input to a sampling FF 609 (an input of a clock before compensation). Otherwise, a connective relationship in FIG. 6 is the same as that in FIG. 13.

Since an output 608 after the adjustment is subjected to sampling, and counting of a High/Low ratio, and the duty adjustment are executed, a duty adjustment operation is a feedback operation (Feed Back control). Hence, an erroneous adjustment can be automatically amended, thereby causing a duty deviation after the adjustment to be smaller in magnitude.

What is claimed is:

1. A duty compensation circuit comprising:
   a duty adjustment circuit for adjusting a duty of a first clock signal;
   a duty detection circuit for detecting the duty of the first clock signal or a duty of a clock-after-adjustment signal adjusted by the duty adjustment circuit; and
   a duty adjustment signal generator for generating a control signal controlling an amount of duty adjustment executed by the duty adjustment circuit and outputting the control signal to the duty adjustment circuit,
   wherein the duty detection circuit executes sampling of the first clock signal or the clock-after-adjustment signal at sampling timing obtained by causing a second clock signal to be delayed by a variable delay circuit, and High periods and Low periods of the first clock signal or the clock-after-adjustment signal are counted at the sampling timing, thereby detecting the duty of the first clock signal or the clock-after-adjustment signal.

2. The duty compensation circuit according to claim 1, wherein the first clock signal is used as the second clock signal.

3. The duty compensation circuit according to claim 1, wherein a clock obtained by dividing the first clock signal is used as the second clock signal.

4. The duty compensation circuit according to claim 1, further comprising:
   a variable delay circuit including a plurality of delay stages connected in series with each other, the delay stages each including a plurality of paths made up by a buffer differing in the number of delay element stages, and a multiplexer for switching among the plurality of the paths,
   wherein a delay amount of the variable delay circuit is changed over by switching among the plurality of the paths of each of the plurality of the delay stages.

5. The duty compensation circuit according to claim 1, further comprising:
   a variable delay circuit,
   wherein the variable delay circuit includes a CML differential stage, and a delay adjustment stage, a delay amount of the variable delay circuit being controlled by controlling an amount of current of a current source of the delay adjustment stage, and a differential amplitude of the CML differential stage.

6. The duty compensation circuit according to claim 1, wherein the duty detection circuit outputs an average of duties of the first clock signal or the clock-after-adjustment signal, detected by a plurality of clocks.

* * * * *